United States Patent [19]
Ohkubo

[11] Patent Number: 5,211,986
[45] Date of Patent: May 18, 1993

[54] METHOD FOR PROCESSING A SUBSTRATE SURFACE AND AN APPARATUS THEREFOR

[75] Inventor: Yoshio Ohkubo, Ibaraki, Japan

[73] Assignee: Matsushita Electric Industrial Co., Ltd., Osaka, Japan

[21] Appl. No.: 554,245

[22] Filed: Jul. 18, 1990

[51] Int. Cl.$^5$ ............................................. B05D 3/12
[52] U.S. Cl. ................................. 427/240; 156/644; 427/369; 437/231
[58] Field of Search .................... 427/240, 355, 369; 437/231; 156/644

[56] References Cited

U.S. PATENT DOCUMENTS

| | | | |
|---|---|---|---|
| 3,379,558 | 4/1968 | Upton | 427/240 |
| 4,385,083 | 5/1983 | Shelley | 427/240 |
| 4,672,023 | 6/1987 | Leung | 427/240 |
| 4,806,504 | 2/1989 | Cleeves | 437/231 |

OTHER PUBLICATIONS

"Remover For Peripheral Resist Buildups" in IBM Technical Bulletin, vol. 19, No. 6, Nov. 1976.

*Primary Examiner*—Janyce Bell
*Attorney, Agent, or Firm*—Ratner & Prestia

[57] ABSTRACT

According to the invention, a viscous substance is applied to the undulated surface of a substrate to be processed, and a gravity-like force greater than that of normal gravity is applied to the viscous substance in the direction orthogonal to the principal plane of the substrate. Consequently, the viscous substance applied on the convex parts flows into the concave parts under the influence of the gravity-like force, so as to fill up the concave parts with the viscous substance. As a result, the top of the surface of the substrate is substantially flattened.

To apply such gravity, the invention employs a rotor, and a substrate holder supported in part of the rotor in a rotatable manner, and by rotating the rotor at high speed, the substrate holder is automatically rotated, and the substrate mounted on the substrate holder is positioned in the direction orthogonal to the rotating plane of the rotor, so that a kind of gravity by centrifugal force may be applied to the viscous substance.

4 Claims, 6 Drawing Sheets

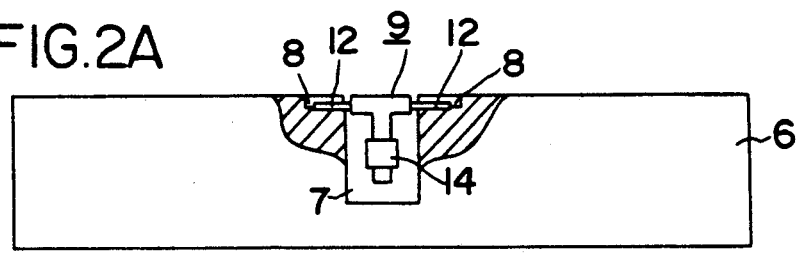
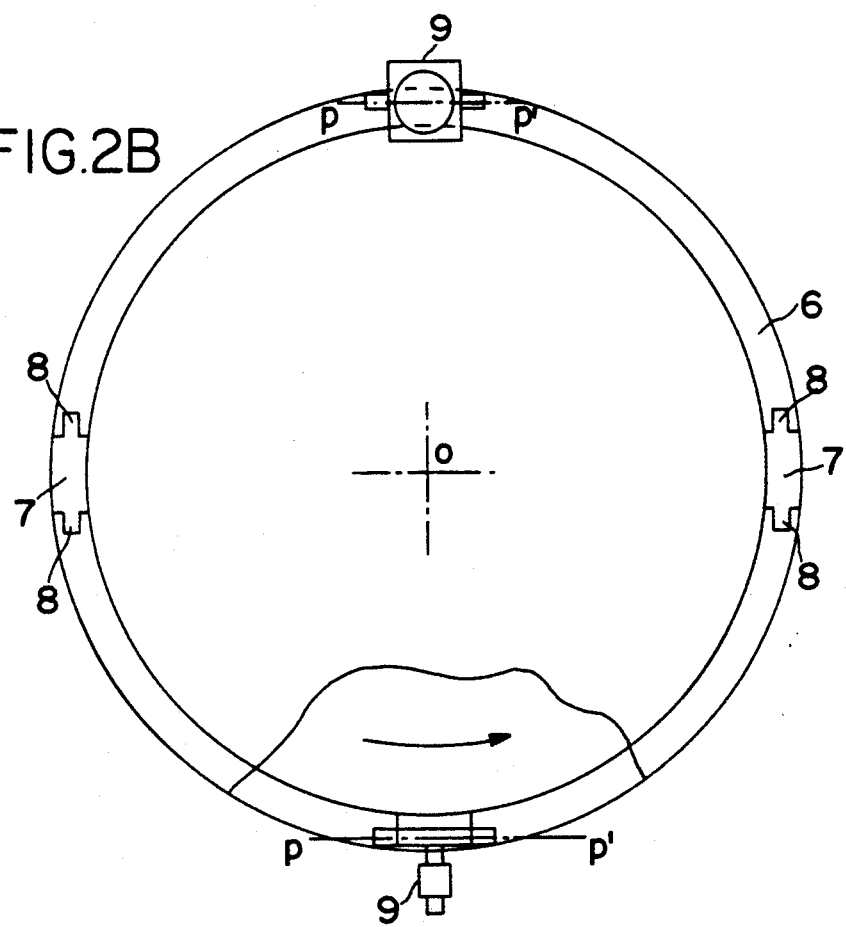

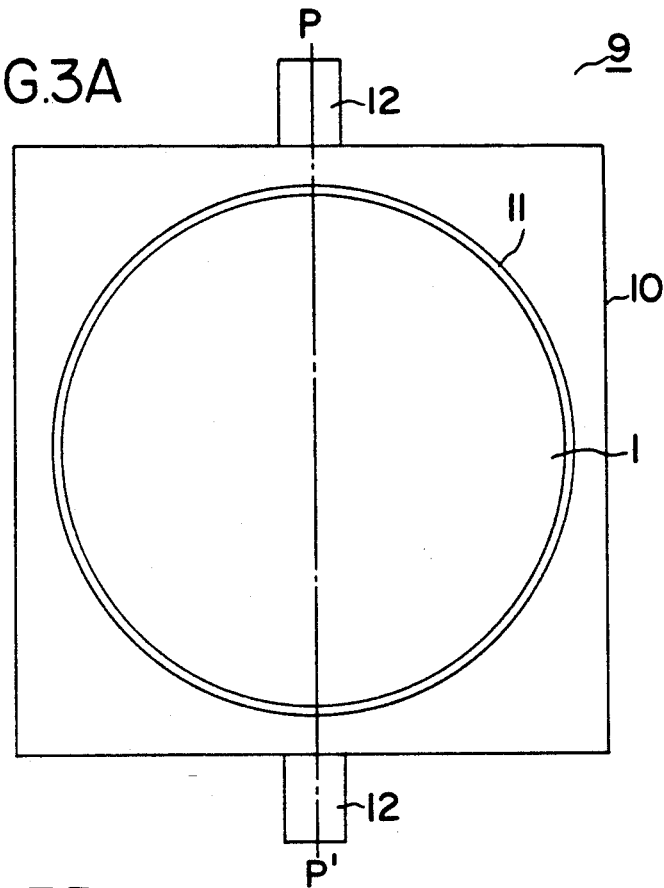
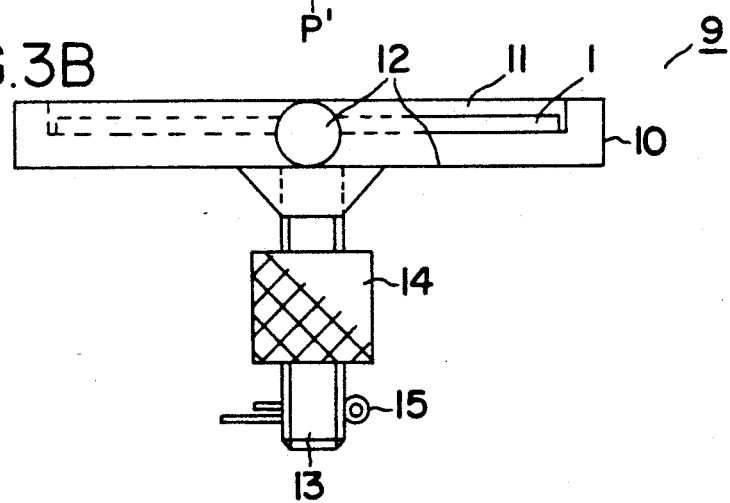

METHOD FOR PROCESSING A SUBSTRATE SURFACE AND AN APPARATUS THEREFOR

BACKGROUND OF THE INVENTION

The present invention relates to a processing method and a processing apparatus for treating a substrate surface such as that of a semiconductor substrate.

In manufacturing semiconductor devices it is often required to process the substrate surface at high density and high precision, but when the substrate surface is extremely undulated as may result from a series of surface processing steps, it is often extremely difficult to process the surface in subsequent steps. In such a case, a technique which is sometimes employed is that of filling the recesses of the substrate surface with an appropriate material to make the substrate surface flat and smooth.

As an example, FIG. 5 shows a part of the surface of a solid state image sensor. As shown in FIG. 5A, an impurity diffusion region 22, such as a photodetector, is formed in a surface region of a semiconductor substrate 21, and then a transparent insulating film 23 is formed on the surface of the semiconductor substrate 21. Although shown conceptually in FIG. 5, actually, silicon gates and oxide films must be successively stacked up on the protective film 23 between adjacent diffusion regions 22, 22. As a result, a concave part 24 is formed above the diffusion region 22 of the semiconductor substrate 21, while a convex part 25 is formed between adjacent diffusion regions 22, 22.

It is difficult to form a color filter on an undulated surface, such as that shown in FIG. 5A. Accordingly, as shown in FIG. 5B, the concave part 24 is filled with an appropriate transparent material 26 to make the substrate surface smooth and flat.

Later, as shown in FIG. 5C, a color filter 27 is formed on the flattened substrate surface. The color filter 27 is composed by applying materials 30 sequentially. These materials are selectively dyed with organic dye-stuffs on the basis of gelatine, casein or the like within the region sectioned by interlayer 28 and separation layer 29. Subsequently, the surface is covered with protective film 31.

FIG. 6 shows another conventional substrate surface flattening method.

As shown in FIG. 6A, the surface of substrate 32 includes concave parts 33 and convex parts 34. An insulating film (for example, an oxide film) 35 is formed on the surface of the substrate 32.

On the surface of substrate 32, as shown in FIG. 6B, for example, a transparent polymer resin 36 having an approximate viscosity is applied. As a result, concave parts 33 are filled with polymer resin 36a. Polymer resin 36b also builds up on the surface of convex parts 34, however.

If polymer resin 36 is not photosensitive, as shown in FIG. 6C, a photoresist 37 is applied on the surface of the polymer resin 36, and the photoresist 37 is patterned by using a photomask (not shown). As a result, the portion 37b corresponding to the convex portion 34 is removed, and the portion 37a corresponding to the concave portion 33 is left over.

When the substrate surface is then etched, as shown in FIG. 6D, the polymer resin 36b on the convex part 34 is removed, and the concave part 33 is filled with the polymer resin 36a and part 37a of photoresist. Afterwards, by removing the residual photoresist 37a, the substrate surface may be almost flattened. In this state, however, since the polymer resin 36a builds up in the marginal area of the concave part 33, substrate surface is not perfectly flat.

Accordingly, the substrate 32 is heated to about 200° C. Then the viscosity of the polymer resin 36a is lowered, and its fluidity is increased, and by the function of the gravity of the polymer resin 36a moves into the concave part 33. As a result, as shown in FIG. 6E, a smooth flat surface is formed on the substrate surface.

Meanwhile, when a photosensitive material is used for the polymer resin 36, for example, a PMMA photoresist, the photosensitive polymer resin 36 may be directly exposed and developed by using a photomask, without using photoresist 37 as shown in FIG. 6C, so that the state in FIG. 6B may be directly formed into the state in FIG. 6E.

In such prior art, however, it is necessary to remove the material on the convex part 34 by photolithography. In other words, it still requires a photomask to be matched with the undulation pattern on the substrate surface, and this photomask must be aligned with the undulation pattern of the substrate surface to be exposed and developed. Accordingly, due to the photolithography process steps, the number of process steps required is increased and the yield may be reduced because of the risk of photomask defects or photomask shape defects induced by dust or the like.

It is hence a first object of the invention to provide a method for processing a substrate surface in order to form a smooth flat surface on the surface of the substrate to be processed, by filling the concave parts of the substrate surface with a substance, without resort to photolithography.

It is a second object of the invention to provide a processing apparatus for easily executing such substrate surface processing method.

SUMMARY OF THE INVENTION

In accordance with the present invention, a viscous substance is applied to an undulated surface of a substantially planar substrate to be processed; a gravity-like force is then applied to the viscous substance in the direction orthogonal to the principal plane of the substrate. This causes the viscous substance applied on the convex parts of the undulated surface to flow into the concave parts thereof, thereby filling up the concave parts with the viscous substance. As a result, the top of the substrate surface is substantially flattened.

To apply such gravity-like force in this process, the invention further includes an apparatus comprising a horizontally disposed rotor and a substrate holder rotatably supported in the marginal part of the rotor. By rotating the rotor at high speed, the substrate holder is automatically rotated from its starting positing (in which a planar substrate held by the holder is substantially horizontally disposed) about the axis of its supporting shaft, which is perpendicular to the radius of the rotor, by the action of centrifugal force on a weight on said holder below the position at which a substrate would be held thereon. A substrate held by the holder is thus positioned with its principal plane orthogonal to the radius of the rotor, thereby applying centrifugal force to the viscous substance.

Other features and effects of the invention will be more clearly understood and appreciated from the following detailed description of the preferred embodiments taken in conjunction with the drawings.

BRIEF DESCRIPTION OF THE DRAWINGS

FIGS. 2A and 2B are a side view and a plan view, respectively, show processing apparatus suitable for executing the method illustrated in FIG. 1;

FIGS. 3A and 3B are a plan view and a side view, respectively, of a substrate holder used in the processing apparatus shown in FIG. 2;

DETAILED DESCRIPTION OF THE INVENTION

A method for processing a substrate surface in accordance with a first embodiment of the invention is described in detail below while referring to FIGS. 1A to 1D.

Figure 1A:
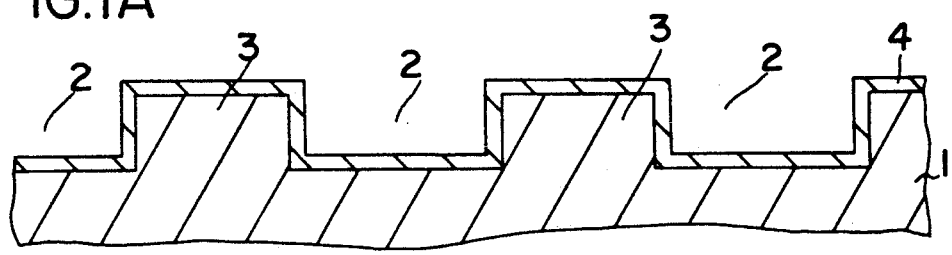
FIGS. 1A 1B, 1C and 1D are process sequence sectional drawings showing the processing method of a substrate surface accord to one of the embodiments of the invention.

As shown in FIG. 1A, the surface of a substrate 1 (such as a semiconductor substrate) to be processed includes concave parts 2 and convex parts 3. Meanwhile, an insulating film 4 such as an oxide film is grown on the surface of the substrate 1, but the insulating film 4 is very thin as compared with the depth of the concave parts 2 or the heights of the convex parts 3. Accordingly, the concave parts 2 and convex parts 3 remain on the surface of the substrate 1 as they are.

Figure 1B:
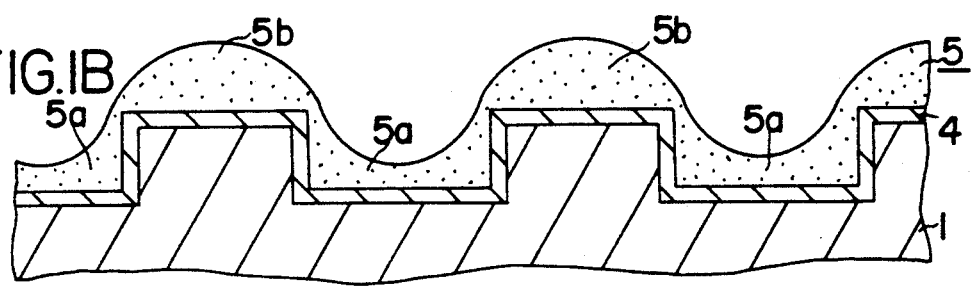
Figure 5A:
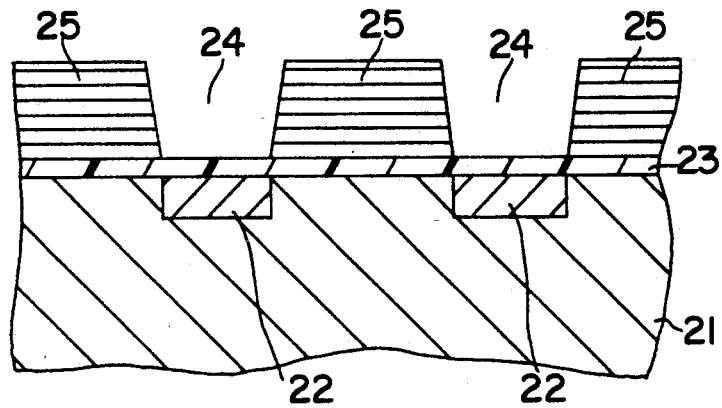
FIGS. 5A 5B and 5C are sectional views showing essential parts of a solid state image sensor in the sequence of a conventional manufacturing process.
Figure 5B:
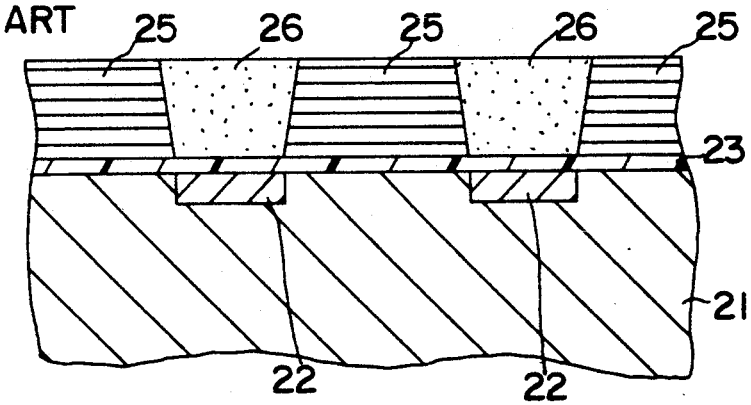
Figure 5C:
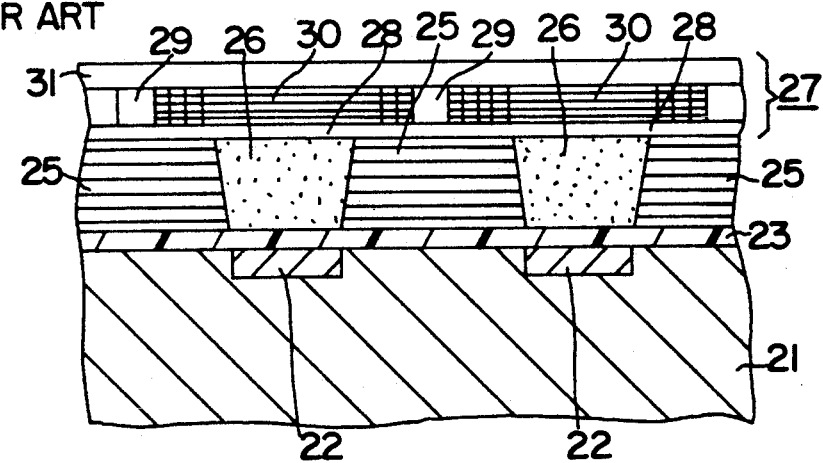
Figure 6A:
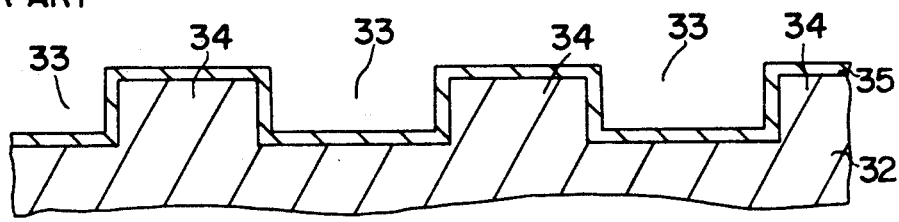
FIGS. 6A 6B 6C 6D and 6E are process sequence sectional views also showing a conventional processing method of a substrate surface.
Figure 6B:
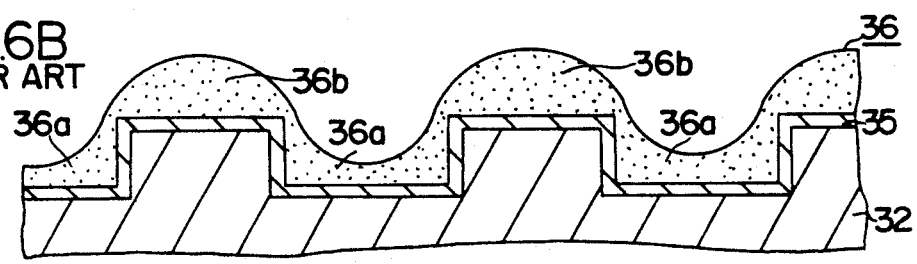
Figure 6C:
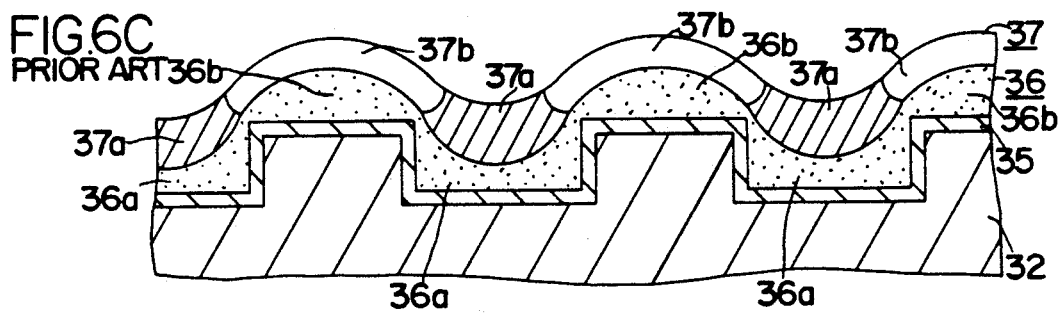
Figure 6D:
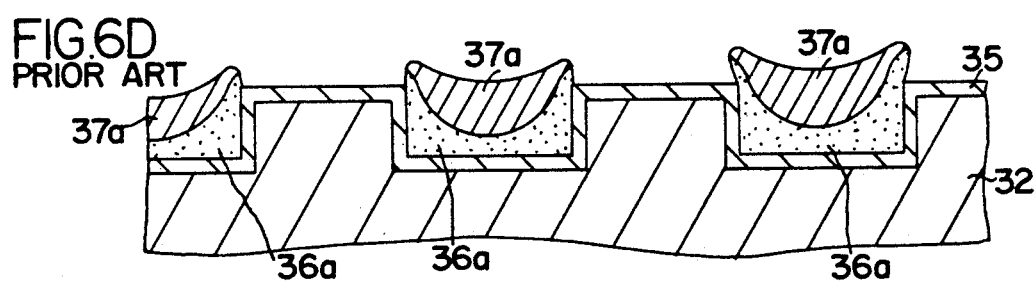
Figure 6E:
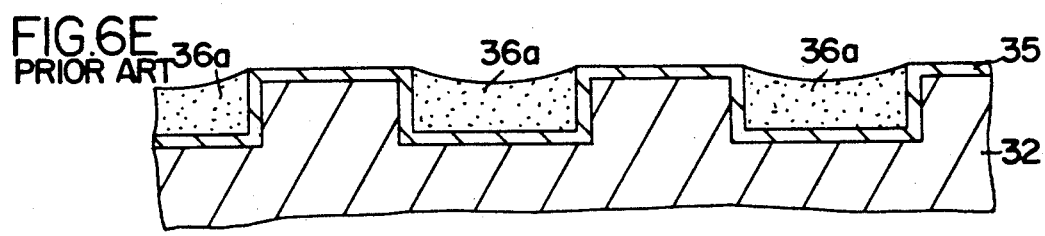

Next, as shown in FIG. 1B, a viscous substance 5 is deposited on the surface of substrate 1. The viscous substance 5 may be applied, for example, by spin coating of a photoresist as used in an ordinary semiconductor manufacturing process, or by deposition of ordinary photoresist by an electrostatic coating or evaporation coating method. Of course, polymer resins other than photoresist may also be applied. As in prior art processes, such as that described with reference to FIG. 5, the viscous substance 5 may be either transparent, translucent or opaque, depending on the purpose of the device. The required characteristics for the viscous substance 5 are adequate viscosity and proper fluidity, and other characteristics are not particularly defined. In FIG. 1B, the coating weight of the viscous substance 5 should be preferably proper, neither excessive nor insufficient, in consideration of the following cautions. That is, as shown in FIG. 1B, parts 5a of the viscous substance 5 sink along the surface of the concave parts 2, while other parts 5b of the viscous substance 5 build up along the surface of the convex parts 3, but the viscous substance 5b on the convex parts 3 flow into the concave parts 2 by the force induced flow processing described below. At this time, it is desired that the total amount, specifically the volume, of the viscous substance 5a initially applied in the concave parts 2 and the viscous substance 5b flowing into the concave parts 2 by processing in accordance with this invention be nearly equal to the amount necessary to fill the concave parts 2. If the total amount of the viscous substance 5 is excessive, the concave parts 2 are brimed over with the viscous substance 5. To the contrary, if the total amount of the viscous substance 5 is too little, the concave parts 2 are not filled up completely. As a result, in either case, a smooth flat surface will not be obtained.

Therefore, the volume of viscous substance used is from slightly less than to slightly more than (and preferably about equal to) to the total volume of the concavities in the undulated surface of the substrate surface to be treated.

Figure 1C:
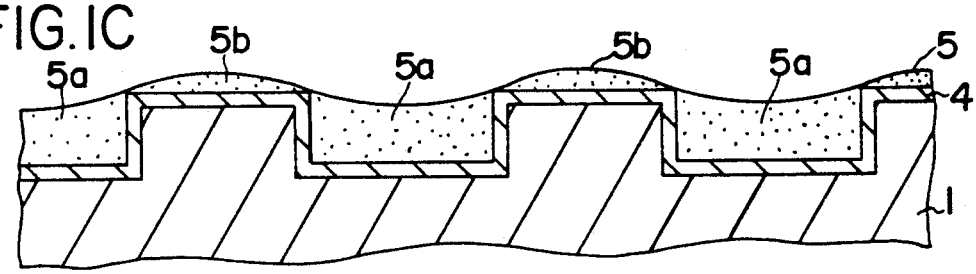
Figure 1D:
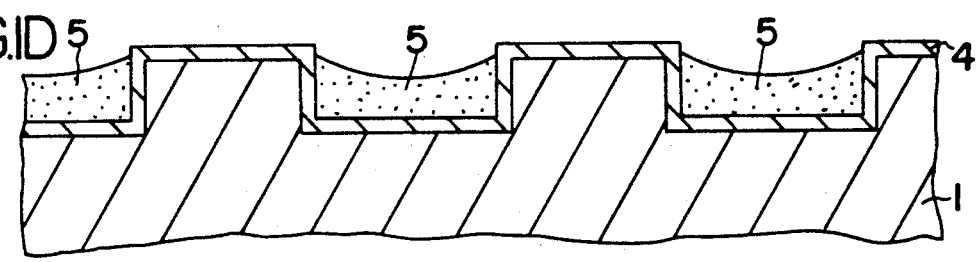

As shown in FIG. 1B, after depositing a proper amount of viscous substance 5 on the surface of the substrate 1, a gravity-like force is applied to substrate 1 in a direction orthogonal to the principal surface of substrate 1 in FIG. 1C. This force is greater than 1G (normal gravity) and is preferably from 10 to several thousand times that of normal gravity. Then, the viscous substance 5b on convex parts 3 is moved by the gravity-like force to flow gradually into concave parts 2 from above convex parts 3, and viscous substance 5b on convex parts 3 decreases as shown in FIG. 1C, while viscous substance 3a in concave parts 2 increases. As this process continues, viscous substance 5b on convex parts 3 will soon entirely flow into concave parts 2, and concave parts 2 are filled with the viscous substance 5. As a result, the surface of the substrate 1 is finally substantially flattened as shown in FIG. 1D.

Thus, according to the first embodiment of the invention shown in FIGS. 1A to 1D, the substrate surface may be flattened without resort to a photolithography process. Therefore, it is not necessary to use a photomask; and a series of photoetching steps, requiring alignment of substrate surface undulation pattern with a photomask, followed by exposure and development, is not needed. Hence, the productivity of the substrate processing may be enhanced, and the lowering of yield due to photomask defects or photomask shape defects induced by dust or the like may be prevented.

In addition, after flattening the substrate surface as shown in FIG. 1C by processing with gravity-like force, it may be useful to apply plasma etching on the entire surface of the viscous substance 5 in order to remove the uppermost portion of viscous substance 5. This results in removal of viscous substance 5b on the convex parts 3 as shown in FIG. 1D. At this time, although part of the surface of the viscous substance 5a in the concave parts 2 may be also removed, it does not matter at all, as a practical matter, because a substantially flat surface is obtained. Particularly at the stage shown in FIG. 1B, if the total amount of the viscous substance 5 is excessive, the viscous substance 5b may be left over on the convex parts 3 and an excessive viscous substance 5a tends to flow over the concave parts 2. In such a case, it is beneficial for obtaining a smooth flat surface to uniformly remove the viscous substance 5a in the concave parts 2 and viscous substance 5b on the convex parts 3 by applying plasma etching on the entire surface of the viscous substance 5.

FIGS. 2A and 2B relate to an embodiment of an apparatus for processing a substrate surface. This apparatus is suited for applying a force of from ten times to thousands of times that of gravity to the viscous substance 5. At four positions on the circumference of a horizontally disposed rotor 6, rotatable about a vertical axis 0, substrate holder housings 7 are disposed. At both sides (or chordal ends) of the substrate holder housing 7, a pair of grooves 8, 8 are formed for supporting the substrate holder which is described below.

FIGS. 3A and 3B show the detailed structure of a substrate holder 9. Substrate holder 9 comprises a support member 10 of square shape, a substrate holding part 11 formed in the center of the support member 10, a pair of shafts or rods 12, 12 formed at both ends on the center line (chord line P—P') of the support member 10, a bolt 13 provided in the middle of the lower surface of the support member 10, a weight 14 engaged with the bolt 13 and a stopper pin 15 for preventing the weight 14 from slipping out.

Figure 4A:
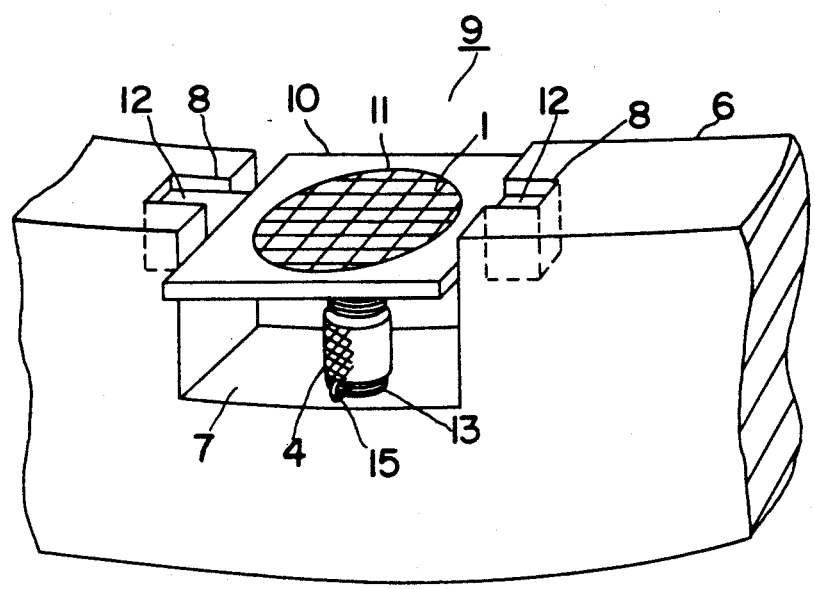
FIGS. 4A and 4B are magnified perspective views of essential parts of the processing apparatus shown in FIG. 2.

As shown in FIGS. 3A and 3B, substrate 1 to be processed (in FIG. 4A, a semiconductor wafer is shown as the substrate 1 to be processed) is placed in the substrate holding part 11 in the support member 10, with its principal plane in a horizontal, upwardly facing direction. In this position the viscous substance 5 is applied on the surface of the substrate 1 as shown in FIG. 1B. Then the rods 12, 12 of the substrate holder 9 are put in the grooves 8, 8 formed in the rotor 6. Needless to say, rotor 6 is at rest at this time. By the action of the weight 14, as shown in the upper part of FIG. 2A and in FIG. 4A, the support member 10 is held in horizontal position, so that the principal plane of substrate 1 is also kept horizontal and in an upwardly facing direction with rotor 6 at rest. Therefore, the viscous substance applied on the surface of the substrate 1 cannot leak out from the surface of the substrate 1 or be shifted to one side of the surface of the substrate 1.

Figure 4B:
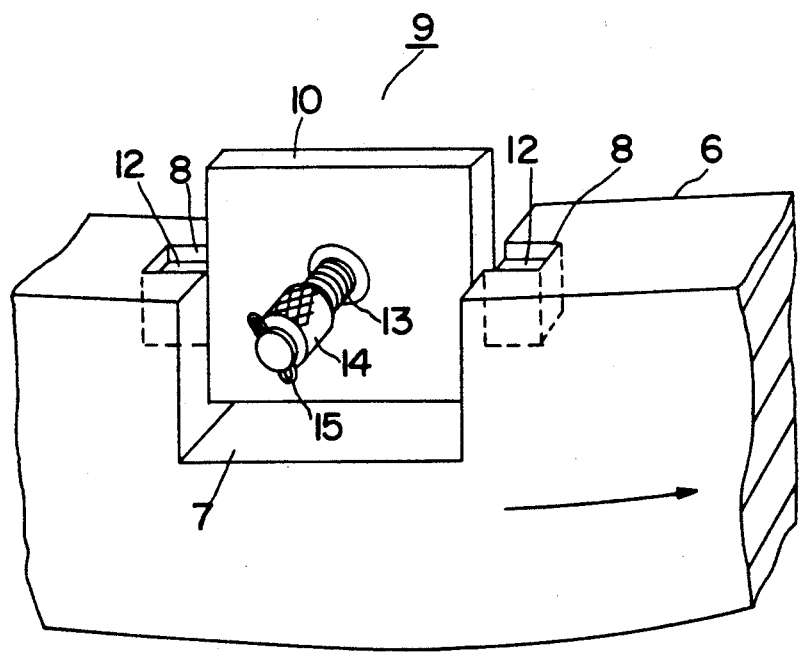

Next, using a motor (not shown) or the like, rotor 6 is rotated at high speed in the direction indicated by arrows in FIGS. 2A and 4B about its vertical axis O. Then by the centrifugal force applied to the weight 14 and the freely rotatable support of rods 12, 12 in grooves 8, 8, the substrate holder 9 is permitted to rotate automatically 90 degrees from the stationary state, as shown in the lower part of FIG. 2B and in FIG. 4B, so that the support member 10 is then orthogonal to the radius of rotor 6 which it intersects. As a result, the centrifugal force in the direction orthogonal to the surface of the substrate 1 is also applied to the viscous substance applied on the surface of the substrate 1. This centrifugal force acts as a kind of gravity and the state in FIG. 1B is changed to FIG. 1C and to FIG. 1D, thereby flattening the surface of the substrate 1.

The gravity loading on the viscous substance by the centrifugal force is proportional to the radius of rotor 6, and is proportional to the square of angular frequency of rotor 6. That is, supposing the mass to be m, the radius of rotor 6 to be r and the angular frequency of rotor 6 to be $\omega$, the gravity force F is expressed as $$F = m/9 \cdot r\omega^2$$

Accordingly, supposing the radius r of the rotor 6 to be 50 cm and the rotating frequency f of the rotor 6 to be 42 revolutions/sec (2520 revolutions/min), it follows that $$r\omega^2 = r \cdot (2\pi f)^2$$
$$= 348 \times 10^6 \text{ cm/sec}^2$$

Since the gravity g in spontaneous state is $$g = 980 \text{ cm/sec}^2,$$

we obtain $$r\omega^2/g = 3.5 \times 10^3$$

That is, in the processing apparatus shown in FIGS. 2 to 4, by setting the radius of the rotor 6 at 50 cm and the rotating frequency of the rotor 6 at 42 revolutions/sec, a force of about $3.5 \times 10^3$ times that of gravity (g) may be applied to the viscous substance 5. As a result, from the state in FIG. 1B to the state in FIG. 1D, the viscous substance 5 is swiftly moved, and a desirably flat surface is formed.

Meanwhile, it is known that such rotating speed of the rotor 6 as specified above may be achieved easily by comparing with, for example, the maximum speed of about 100,000 revolutions/min of centrifugal separators employed generally at present.

When a semiconductor substrate is used as the substrate to be processed, it is beneficial to enclose the rotary drive mechanism portion to isolate it from the rotating space of the rotor 6 or to keep this drive in a reduced atmosphere so that the dust generated from the rotary drive mechanism of the rotor 6 may not deposit on the surface of the substrate to be processed.

In the foregoing embodiment, a semiconductor substrate is shown as the substrate to be processed but dielectric substrates and metallic substrates may be employed as well. In short, the invention may be applied widely where the substrate surface has fine undulations, for the purpose of filling up the concave portions thereof with a viscous substance.

I claim:

1. A method for coating a substrate having concave and convex areas in a surface thereof, said method comprising the steps of:
    setting said substrate on a substrate holder which is capable of rotation about a central axis parallel to the plane of said substrate holder,
    applying a viscous coating material to both said concave and convex areas in a surface of said substrate while said substrate is supported in a horizontal position, and
    spinning said substrate holder about an axis vertical to and spaced apart from the plane of said substrate holder, whereby said substrate holder is gradually rotated about said central axis parallel to the plane of said substrate holder from a horizontal position to a vertical position, wherein a centrifugal force greater than 1G is continuously applied to said substrate in a direction orthogonal to the surface of said substrate so as to cause said viscous coating material in said convex areas to flow into adjacent concave areas and the surface of said substrate is coated substantially flat.

2. A method as set forth in claim 1 wherein the volume of said coating material applied to said concave and convex areas is within a range from less than the sum of the volumes of said concave areas to more than said sum.

3. A method as set forth in claim 2 wherein the volume of said coating material exceeds the sum of the volumes of said concave areas, said method further comprising etching the entire surface of said coating material so as to remove said coating material from said convex areas.

4. A method as set forth in claim 1 wherein said substrate is weighted so that said surface of said substrate tends to face inwardly toward said vertical axis during said rotating about said vertical axis.

* * * * *